(12) United States Patent
Ogasawara

(10) Patent No.: US 8,148,934 B2
(45) Date of Patent: Apr. 3, 2012

(54) VOLTAGE STEP-UP/DOWN CONVERTER

(75) Inventor: Terumoto Ogasawara, Gamagori (JP)

(73) Assignee: Denso Corporation, Kariya (JP)

( * ) Notice: Subject to any disclaimer, the term of this patent is extended or adjusted under 35 U.S.C. 154(b) by 311 days.

(21) Appl. No.: 12/690,268

(22) Filed: Jan. 20, 2010

(65) Prior Publication Data

US 2010/0181946 A1   Jul. 22, 2010

(30) Foreign Application Priority Data

Jan. 22, 2009 (JP) .................................. 2009-11654

(51) Int. Cl.
*H02P 3/18* (2006.01)

(52) U.S. Cl. ............................ 318/727; 318/801; 363/16
(58) Field of Classification Search .................. 318/139, 318/727, 800, 801, 803, 806; 363/16, 17, 363/89

See application file for complete search history.

(56) References Cited

U.S. PATENT DOCUMENTS

| 6,724,644 B2 * | 4/2004 | Loef ................................. 363/89 |
| 6,888,728 B2 * | 5/2005 | Takagi et al. ..................... 363/17 |
| 7,081,744 B2 * | 7/2006 | Nakanishi et al. ............... 324/67 |
| 2006/0227577 A1 * | 10/2006 | Horiuchi et al. ........... 363/21.02 |
| 2007/0195556 A1 * | 8/2007 | Nakamura et al. .............. 363/16 |
| 2009/0290384 A1 * | 11/2009 | Jungreis ............................ 363/17 |

FOREIGN PATENT DOCUMENTS

JP   2003-267247   9/2003

* cited by examiner

*Primary Examiner* — Rina Duda

(74) *Attorney, Agent, or Firm* — Nixon & Vanderhye PC

(57) ABSTRACT

A motor control apparatus includes a step-up/down converter and an inverter. The converter includes a coil, MOSFETs, capacitors and a control circuit. The control circuit turns on the MOSFET in the high potential side, while tuning off the MOSFET in the low potential side. After a predetermined time, the control circuit turns off the MOSFET in the high potential side and then turns on the MOSFET in the low potential side. It is checked whether the MOSFET, which is switched in the step-down operation, is normal or abnormal based on the voltages of the capacitors. The capacitors produce specific changes in the respective voltages in correspondence to the check result. Thus, the abnormality of the MOSFET can be determined based on the changes.

8 Claims, 1 Drawing Sheet

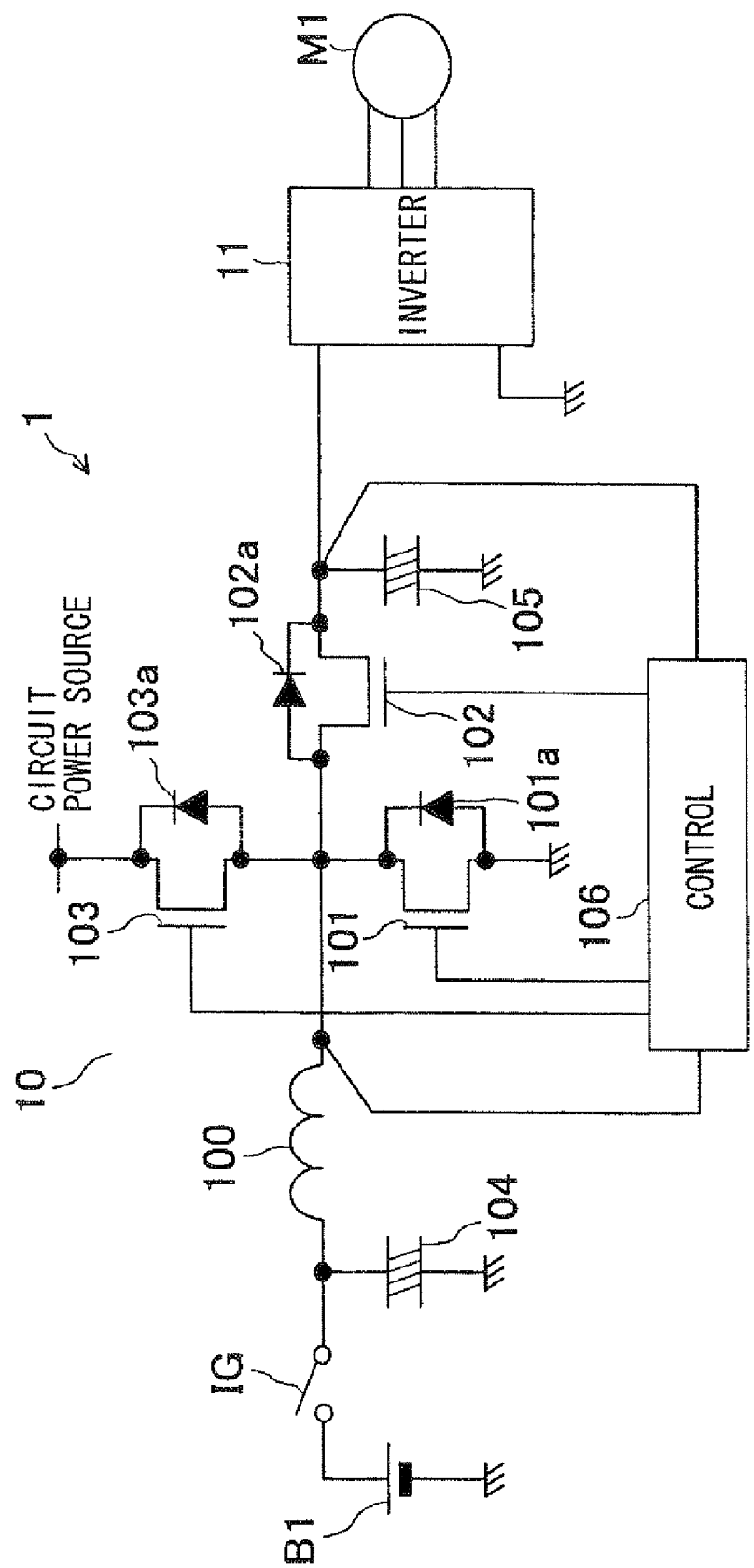

US 8,148,934 B2

VOLTAGE STEP-UP/DOWN CONVERTER

CROSS REFERENCE TO RELATED APPLICATION

The present application is based on and incorporates herein by reference Japanese patent application No. 2009-11654 filed on Jan. 22, 2009.

FIELD OF THE INVENTION

The present invention relates to a voltage step-up/down converter for stepping up or stepping down a DC voltage.

BACKGROUND OF THE INVENTION

As a conventional apparatus including a voltage step-up/down converter, which steps up and down a DC voltage, an electric power steering apparatus is disclosed in JP 2003-267247 A. This electric power steering apparatus includes a voltage step-up/down circuit. The voltage step-up/down circuit is configured with an inductor, a step-up switch, a step-down switch and a step-up/down drive circuit. In the voltage step-up operation, the step-up/down drive circuit turns on and off the step-up switch to step-up (raise) a DC voltage outputted from a battery and supply the stepped-up voltage to a motor drive circuit. In the voltage step-down operation, the step-up/down drive circuit turns on and off the step-down switch to step-down (lower) a DC voltage outputted from the motor drive circuit and supply the stepped-down voltage to the battery.

If the step-down switch is short-circuited in the step-up/down circuit, the voltage step-up operation cannot be performed properly. It is not possible to detect short-circuit failure of the step-down switch.

SUMMARY OF THE INVENTION

It is therefore an object of the present invention to provide a voltage step-up/down converter, which detects abnormality of a switch turned on and off in a voltage step-down operation.

According to the present invention, a voltage step-up/down converter includes a coil, a first switch having one end connected to one end of the coil and the other end grounded, a first rectifier connected in parallel to the first switch to allow current flow only from the other end to the one end of the first switch, a second switch having one end connected to a junction between the coil and the first switch, a second rectifier connected in parallel to the second switch to allow current flow only from the one end to the other end of the second switch, a first capacitor having one end connected to the other end of the coil and the other end grounded for smoothing a DC voltage outputted to the other end of the coil, a second capacitor having one end connected to the other end of the second switch and the other end grounded for maintaining a DC voltage outputted to the other end of the second switch, and a third switch having one end connected to a circuit power source and the other end connected to a junction among the coil, the first switch and the second switch. The voltage step-up/down converter further includes a control circuit, which turns on and off the first switch in a voltage step-up operation and turns on and off the second switch in a voltage step-down operation. In the voltage step-up operation, the DC voltage at the other end of the coil is stepped up and outputted from the other end of the second switch. In the voltage step-down operation, the DC voltage at the other end of the second switch is stepped down and outputted from the other end of the coil. The control circuit further checks whether the second switch is normal or abnormal based on voltages of the first capacitor and the second capacitor, by turning on the third switch while turning on the first switch, then turning off the third switch and then turning on the first switch.

BRIEF DESCRIPTION OF THE DRAWINGS

The above and other objects, features and advantages of the present invention will become more apparent from the following detailed description made with reference to the accompanying drawings. In the drawings:

Sole FIGURE is a circuit diagram showing a motor control apparatus according to an embodiment of the present invention.

DETAILED DESCRIPTION OF THE PREFERRED EMBODIMENT

The present invention will be described in detail with reference to one embodiment. In this embodiment, a voltage step-up/down converter is applied exemplarily to a motor control apparatus, which controls an AC motor mounted in a vehicle.

Referring to the FIGURE, a motor control apparatus 1 is provided for controlling an AC motor M1 mounted in a vehicle. The apparatus 1 includes a voltage step-up/down converter 10 and an inverter 11.

The voltage step-up/down converter 10 is configured to step up or step down a direct current (DC) voltage. The voltage step-up/down converter 10 is configured to step up (boost) a DC voltage outputted from a battery 61 and supply the stepped-up voltage to the inverter 11, when the AC motor M1 is in the power running condition. The voltage step-up/down converter 10 is configured to supply an output voltage outputted from the inverter 11 to the battery B1, when the AC motor M1 is in the regenerative braking condition. The voltage step-up/down converter 10 includes an inductor coil 100, a MOSFET (first switch) 101, a MOSFET 102 (second switch), a MOSFET (third switch) 103, a capacitor (first capacitor) 104, a capacitor (second capacitor) 105 and a control circuit (control means) 105.

The MOSFET 101 is for stepping up the DC voltage outputted from the battery 61 by being turned on and off periodically. The MOSFET 101 is also for checking whether the MOSFET 102 is normal or abnormal by being turned on and off. The drain and the source of the MOSFET 101 are connected to one end of the coil 100 and grounded, respectively. The gate of the MOSFET 101 is connected to the control circuit 106. The MOSFET 101 is thus provided in the low potential side. The MOSFET 101 has a parasitic diode (first rectifier) 101a. The parasitic diode 101a is connected in parallel to the drain and the source of the MOSFET 101. Specifically, the anode and the cathode of the parasitic diode 101a are connected to the source and the drain of the MOSFET 101, respectively, so that a current flows only from the source to the drain of the MOSFET 101.

The MOSFET 102 is for restoring the regenerative output of the inverter 11 to the battery B1 by being turned on and off periodically. The source of the MOSFET 102 is connected to a junction between the coil 100 and the MOSFET 101. The gate of the MOSFET 102 is connected to the control circuit 106. The MOSFET 102 has also a parasitic diode (second rectifier) 102a. The parasitic diode 102a is connected in parallel to the drain and the source of the MOSFET 102. Specifically, the anode and the cathode of the parasitic diode 102a are connected to the source and the drain of the MOSFET 102, respectively, so that a current flows only from the source to the drain of the MOSFET 102. The source and the drain of the MOSFET 102 is connected in series with the coil 100.

The MOSFET 103 is for checking whether the MOSFET 102 is normal or abnormal by being turned on and off. The source of the MOSFET 103 is connected to a junction among the coil 100, the MOSFET 101 and the MOSFET 103. The drain of the MOSFET 103 is connected to a circuit power source. The MOSFET 103 is thus provided in the high potential side and connected in series with the MOSFET 101. The gate of the MOSFET 103 is connected to the control circuit 106. The MOSFET 103 has a parasitic diode 103a. The parasitic diode 103a is connected in parallel to the drain and the source of the MOSFET 103. Specifically, the anode and the cathode of the parasitic diode 103a are connected to the source and the drain of the MOSFET 103, respectively, so that a current flows only from the source to the drain of the MOSFET 103.

The capacitor 104 is for smoothing the DC voltage supplied to the other end of the coil 100. One end and the other end of the capacitor 104 are connected to the other end of the coil 100 and grounded, respectively. The one end of the capacitor 104 is connected to the positive terminal of the battery B1 through an ignition switch 1G. The negative terminal of the battery B1 is grounded.

The capacitor 105 is for maintaining the stepped-up voltage. One end of the capacitor 105 is connected to the drain of the MOSFET 102. The other end of the capacitor 105 is grounded. The one end of the capacitor 105 is connected to the inverter 11.

The control circuit 106 is configured to turn on and off the MOSFETs 101 and 102 thereby to step up the voltage outputted from the battery 131 or restore the regenerative output of the inverter 11 to the battery 61. The control circuit 106 is also configured to check whether the MOSFET 102 is normal or abnormal based on the voltages of the capacitors 104 and 105 by turning on and off the MOSFETs 101 and 103. The control circuit 106 is connected to each gate of the MOSFETs 101 to 103. The control circuit 106 is also connected to the one end of the coil 100 and the one end of the capacitor 105.

The inverter 11 is for converting the DC power to the AC power or the AC power to the DC power. The inverter 11 is configured to convert the output power of the voltage step-up/down converter 10 to the AC power and supply the converted power to the AC motor M1, when the AC motor M1 is in the power running condition. The inverter 11 is configured to convert the output power of the voltage step-up/down converter 10 to the DC power and supply the converted power to the voltage step-up/down converter 10, when the AC motor M1 is in the regenerative braking condition. The DC positive terminal and the DC negative terminal of the inverter 11 are connected to the one end of the capacitor 105 and grounded, respectively. The AC terminals of the inverter 11 are connected to the AC motor M1.

The operation of the motor control apparatus will be described with reference to the FIGURE.

The voltage step-up/down converter 10 checks whether the MOSFET 102 is normal or abnormal immediately after starting its operation, when the ignition switch IG is turned on. Specifically, the control circuit 106 turns on the MOSFET 103, while maintaining the MOSFET 101 and 102 being turned off. The capacitor 104 is thus connected to the circuit power source through the MOSFET 103 and charged. The capacitor 105 is also connected to the circuit power source through the MOSFET 103 and the parasitic diode 102a and charged. As a result, the capacitors 104 and 105 are charged to substantially equal charged voltages. The voltage of the capacitor 105 is slightly lower than that of the capacitor 104 by a forward voltage of the parasitic diode 102a.

After a predetermined time required for capacitor charging described above, the control circuit 106 turns off the MOSFET 103 and thereafter turns on the MOSFET 101, while maintaining the MOSFET 102 being turned off. The capacitor 104 is thus grounded through the coil 100 and the MOSFET 101 and discharged. If the MOSFET 102 is normal, the capacitor 105 is prevented from being discharged because reverse flow of current is stopped by the parasitic diode 102a. The voltage of the capacitor 105 is thus maintained at the charged voltage. If the MOSFET 102 is abnormal due to short-circuit failure, the capacitor 105 is grounded through the MOSFET 102 and 101 and discharged. As a result, the voltage of the capacitor 105 decreases and becomes substantially equal to the voltage of the capacitor 104.

After the predetermined time required for capacitor charging, the control circuit 106 checks whether the MOSFET 102 is normal or abnormal based on the voltages of the capacitors 104 and 105. The control circuit 106 determines that the MOSFET 102 has abnormality of the short-circuit failure, if the voltage of the capacitor 105 decreases to be lower than a voltage threshold after the MOSFET 101 is turned on. The threshold voltage is set to be lower than the voltage to which the capacitor 105 is charged immediately before the MOSFET 101 is turned on. The abnormality thus determined may be displayed or required countermeasure may be taken.

The control circuit 106 determines that the MOSFET 102 has no short-circuit failure and is normal, if the voltage of the capacitor 105 is higher than the voltage of the capacitor 104. When the AC motor M1 is in the power running condition, the control circuit 106 turns on and off the MOSFET 101 so that the DC voltage outputted from the battery B1 is stepped up and supplied to the inverter 11. The inverter 11 converts the DC voltage outputted by the voltage step-up/down converter 10 to the AC voltage and supplies the same to the AC motor M1. When the AC motor M1 is in the regenerative braking condition, the inverter 11 converts the AC voltage outputted from the AC motor M1 to the DC voltage and supplies the DC voltage to the voltage step-up/down converter 10. The control circuit 106 turns on and off the MOSFET 102 to step down the DC voltage outputted from the inverter 11 and supplies the stepped-down DC voltage to the battery B1.

According to the embodiment, when the MOSFET 103 is turned on with the MOSFET 101 and 102 being maintained in the turned-off condition, the capacitors 104 and 105 are charged to substantially the same charge voltage. When the MOSFET 103 is turned off and the MOSFET 101 is turned on thereafter, the voltage of the capacitor 104 falls. If the MOSFET 102 is normal, the voltage of the capacitor 105 is maintained at the charged voltage. If the MOSFET 102 is in the short-circuit failure, the voltage of the capacitor 105 falls. Thus, a characteristic change occurs between the voltages of the capacitors 104 and 105 depending on the presence/absence of the MOSFET 102. Therefore it is possible to determine the presence/absence of the abnormality of the MOSFET 102, which is turned on and off at the time of the voltage step-down operation, based on the voltages of the capacitors 104 and 105.

When the MOSFET 101 is turned on, the capacitor 104 charged discharges. The voltage of the capacitor 104 thus falls. If the MOSFET 102 is normal, the capacitor 105 charged does not discharge. The voltage of the capacitor 105 is maintained at the charged voltage. As long as the MOSFET 102 is normal, the voltage of the capacitor 105 is higher than that of the capacitor 104 when the capacitor 104 is discharged. Therefore it is possible to determine surely that the MOSFET 102 has no short-circuit failure and is normal, if the voltage of the capacitor 105 is higher than that of the capacitor 104.

If the MOSFET 102 has the short-circuit failure, the capacitor 105 is discharged. Therefore, the voltage of the capacitor 105 falls to be lower than before the MOSFET 101 is turned on. Therefore it is possible to determine surely that the MOSFET 102 has short-circuit failure and is abnormal, if the voltage of the capacitor 105 falls to be lower than before the MOSFET 101 is turned on. Specifically, the MOSFET 102 is determined to be in the short-circuit failure if the voltage of the capacitor 105 falls below the voltage threshold.

In addition, according to the embodiment, it is possible to check whether the MOSFET 102, which is turned on and off at the time of the voltage step-down operation (regenerative braking operation), is normal or abnormal in the voltage step-up/down converter 10 provided between the battery B1 and the inverter 11, which controls the AC motor M1 mounted in the vehicle.

The embodiment, in which the control circuit 106 turns on the MOSFET 103 while turning off the MOSFET 101 and 102, turns off the MOSFET 103 while turning off the MOSFET 102 after the predetermined time, and thereafter turns on the MOSFET 101, may be modified. For example, the MOSFET 102 may be turned on when the MOSFET 103 is turned on, and the MOSFET 102 may be turned off when the MOSFET 103 is turned off. That is, the MOSFET 102 may be turned on and off in synchronization with the MOSFET 103. In this case, the capacitor 105 is charged through the MOSFET 102. As a result, the charged voltage of the capacitor 105 is raised by about the forward voltage of the parasitic diode 102a in comparison to the above-described embodiment, in which the capacitor 105 is charged through the parasitic diode 102a.

The embodiment, in which the control circuit 106 determines that the MOSFET 102 has abnormality of short-circuit failure if the voltage of the capacitor 105 is lower than the threshold voltage, may also be modified. For example, the MOSFET 102 may be determined to be in the short-circuit failure, if the voltage of the capacitor 105 changes more than a change threshold between before and after the MOSFET 101 is turned on. In this case, the voltage of the capacitor 105 decreases to be lower than before the MOSFET 101 is turned on. As a result, the short-circuit failure of the MOSFET 102 is determined surely.

The embodiment may further be modified such that the control circuit 106 determines the short-circuit failure of the MOSFET 102 if the difference between the voltages of the capacitors 104 and 105 is less than a voltage difference threshold. If the MOSFET 102 is in the short-circuit failure, both voltages of the capacitors 104 and 105 fall and are very close to each other after the MOSFET 101 is turned on. Therefore, it is possible to surely determine by the control circuit 106 that the MOSFET 102 is in the short-circuit failure if the difference of voltages of the capacitors 104 and 105 are less than the voltage difference threshold.

The embodiment, in which the MOSFETs 101 to 103 are used as switches, may still further be modified such that IGBTs, for example, are used as switches.

What is claimed is:

1. A voltage step-up/down converter comprising:
   a coil;
   a first switch having one end connected to one end of the coil and the other end grounded;
   a first rectifier connected in parallel to the first switch to allow current flow only from the other end to the one end of the first switch;
   a second switch having one end connected to a junction between the coil and the first switch;
   a second rectifier connected in parallel to the second switch to allow current flow only from the one end to the other end of the second switch;
   a first capacitor having one end connected to the other end of the coil and the other end grounded for smoothing a DC voltage outputted to the other end of the coil;
   a second capacitor having one end connected to the other end of the second switch and the other end grounded for maintaining a DC voltage outputted to the other end of the second switch;
   a third switch having one end connected to a circuit power source and the other end connected to a junction among the coil, the first switch and the second switch; and
   a control circuit configured to turn on and off the first switch in a voltage step-up operation, in which the DC voltage at the other end of the coil is stepped up and outputted from the other end of the second switch, and the control circuit configured to turn on and off the second switch in a voltage step-down operation, in which the DC voltage at the other end of the second switch is stepped down and outputted from the other end of the coil,
   wherein the control circuit is further configured to check whether the second switch is normal or abnormal based on voltages of the first capacitor and the second capacitor, by turning on the third switch while turning on the first switch, then turning off the third switch and then turning on the first switch.

2. The voltage step-up/down converter according to claim 1,
   wherein the control circuit is configured to turn on the second switch when the third switch is turned on, and turn off the second switch when the third switch is turned off.

3. The voltage step-up/down converter according to claim 1,
   wherein the control circuit is configured to determine that the second switch is normal if the voltage of the second capacitor is higher than that of the first capacitor.

4. The voltage step-up/down converter according to claim 1,
   wherein the control circuit is configured to determine that the second switch is in short-circuit failure, if the voltage of the second capacitor falls to be lower than immediately before the first switch is turned on.

5. The voltage step-up/down converter according to claim 4,
   wherein the control circuit is configured to determine that the second switch is in the short-circuit failure, if the voltage of the second capacitor is less than a voltage threshold.

6. The voltage step-up/down converter according to claim 4, wherein the control circuit is configured to determine that the second switch is in the short-circuit failure, if a change of the voltage of the second capacitor between before and after the first switch is turned on.

7. The voltage step-up/down converter according to claim 1,
   wherein the control circuit is configured to determine that the second switch is in the short-circuit failure, if a difference between the voltages of the first capacitor and the second capacitor is less than a voltage threshold.

8. The voltage step-up/down converter according to claim 1,
wherein the other end of the coil and the one end of the first capacitor are connected to a battery of a vehicle so that a DC voltage of the battery is stepped up by turning on and off of the first switch, and the other end of the second switch and the one end of the capacitor are connected to an inverter so that a DC voltage outputted from the inverter is stepped down by turning on and off of the second switch.

* * * * *